United States Patent
Cho et al.

(10) Patent No.: US 10,276,736 B1
(45) Date of Patent: Apr. 30, 2019

(54) FLEXIBLE SOLAR ARRAY

(71) Applicant: SolAero Technologies Corp., Albuquerque, NM (US)

(72) Inventors: Benjamin Cho, Albuquerque, NM (US); Dwight Hazlett, Rio Rancho, NM (US); Cory Tourino, Edgewood, NM (US); Brian Guzie, Rio Rancho, NM (US)

(73) Assignee: SolAero Technologies Corp., Albuquerque, NM (US)

(*) Notice: Subject to any disclaimer, the term of this patent is extended or adjusted under 35 U.S.C. 154(b) by 0 days.

(21) Appl. No.: 16/198,283

(22) Filed: Nov. 21, 2018

Related U.S. Application Data

(60) Division of application No. 15/439,409, filed on Feb. 22, 2017, now Pat. No. 10,164,136, which is a continuation-in-part of application No. 14/334,878, filed on Jul. 18, 2014, now abandoned.

(51) Int. Cl.
*H02S 40/34* (2014.01)
*H01L 31/00* (2006.01)
*H01L 31/046* (2014.01)
*H01L 31/0392* (2006.01)
*H01L 31/05* (2014.01)
*H01L 31/048* (2014.01)
*H01L 31/02* (2006.01)

(52) U.S. Cl.
CPC ...... *H01L 31/046* (2014.12); *H01L 31/02013* (2013.01); *H01L 31/03926* (2013.01); *H01L 31/048* (2013.01); *H01L 31/0504* (2013.01); *H01L 31/0508* (2013.01); *H02S 40/34* (2014.12)

(58) Field of Classification Search
CPC ............. H01L 31/046; H01L 31/02013; H01L 31/03926; H01L 31/048; H01L 31/0504; H01L 31/0508; H02S 40/34
See application file for complete search history.

(56) References Cited

U.S. PATENT DOCUMENTS

| | | | |
|---|---|---|---|
| 6,313,396 B1 * | 11/2001 | Glenn | H01L 31/042 136/244 |
| 9,620,658 B1 | 4/2017 | Spence et al. | |
| 10,067,117 B2 * | 9/2018 | Tyler | G01N 33/4836 |
| 10,164,136 B1 * | 12/2018 | Cho | H01L 31/046 |
| 2011/0067741 A1 * | 3/2011 | DeLeo | E04H 1/1277 135/96 |

* cited by examiner

*Primary Examiner* — Seahvosh Nikmanesh

(57) ABSTRACT

A flexible solar array for a spacecraft or aviation craft including a flexible backing substrate with conductive trace (s) formed thereon; solar cell subassemblies disposed over the flexible backing substrate, each of the solar cell subassemblies at least including a solar cell; and an adhesive layer interposed between the solar cell subassemblies and the flexible backing substrate, with the solar cell attached to the flexible backing substrate. The adhesive layer includes openings for exposing the corresponding conductive traces so that the exposed metal traces are adaptable to interconnect the solar cells of the respective adjacent solar cell subassemblies through the openings.

15 Claims, 4 Drawing Sheets

FLEXIBLE SOLAR ARRAY

REFERENCE TO RELATED APPLICATIONS

This application is a division of U.S. patent application Ser. No. 15/439,409, now U.S. Pat. No. 10,164,136, which is a continuation-in-part of U.S. application Ser. No. 14/334,878, filed Jul. 18, 2014.

GOVERNMENT RIGHTS STATEMENT

This invention was made with government support under Contract No. 000-11-C0585 awarded by the National Reconnaissance Office of the United States Government. The Government has certain rights in the invention.

All of the above noted applications are herein incorporated by reference in their entirety.

BACKGROUND OF THE INVENTION

Field of the Invention

The present invention relates to a flexible solar array, particularly a flexible solar array for space/aviation applications, and a method for fabricating the same.

Description of Related Art

Conventional space solar arrays are typically comprised of solar cells bonded to a rigid backing substrate. Next generation solar arrays for space application may be in a flexible/rollable configuration to achieve more efficient packing in a launch vehicle. As a way to cost reduction at the solar array level, the concept of a "Flex String Array" (FSA) has been proposed, which is a modular photovoltaic sub-component consisting of a string of multiple solar cells attached to a flexible backing substrate.

There exist needs in the related art to provide a FSA amenable to high volume automated manufacturing techniques and able to withstand multiple roll and unroll deployment cycles.

SUMMARY

According to an embodiment of the present disclosure, there is provided a flexible solar array comprising: a flexible backing substrate comprising a first major surface and an opposing second major surface, with conductive trace(s) formed on the first major surface of the flexible backing substrate by metal evaporation, wherein the flexible backing substrate further comprises through holes under the respective conductive traces on the first major surface of the flexible backing substrate, and the through holes are fully covered by the respective conductive traces on the first major surface of the flexible backing substrate and distanced from edges of the respective conductive traces on the first major surface of the flexible backing substrate; solar cell subassemblies disposed over the first major surface of the flexible backing substrate, each of the solar cell subassemblies at least including a solar cell; and an adhesive layer interposed between the solar cell subassemblies and the first major surface of the flexible backing substrate, and attaching the solar cells to the first major surface of the flexible backing substrate, wherein the adhesive layer includes openings for exposing the corresponding conductive traces on the first major surface of the flexible backing substrate so that the exposed conductive traces are adaptable to interconnect the solar cells of the respective adjacent solar cell subassemblies through the openings, wherein the solar cell comprises bonding areas on opposite functional surfaces of the solar cell; wherein the solar cell subassembly further comprises a metal or metal alloy interconnector disposed in close proximity of a side face of the solar cell, one end of the interconnector being bonded to a top one of the bonding areas and the other end thereof being bonded directly to a respective conductive trace on the first major surface of the flexible backing substrate; and wherein the interconnectors of adjacent solar cell subassemblies are coupled with a corresponding conductive trace for the adjacent solar cell assemblies.

According to another embodiment of the present disclosure, there is provided a method for fabricating a flexible solar array, comprising: providing a flexible backing substrate comprising a first major surface and an opposing second major surface; forming one or more conductive traces on the first major surface of the flexible backing substrate by metal evaporation, wherein the flexible backing substrate further comprises through holes under the respective conductive traces on the first major surface of the flexible backing substrate, and the through holes are fully covered by the respective conductive traces on the first major surface of the flexible backing substrate and distanced from edges of the respective conductive traces on the first major surface of the flexible backing substrate; aligning solar cell subassemblies to the first major surface of the flexible backing substrate, the solar cell subassembly at least including a solar cell comprising bonding components on opposite functional surfaces of the solar cell, and wherein the solar cell subassembly further comprises a metal or metal alloy interconnector disposed in close proximity of a side face of the solar cell, one end of the interconnector being bonded to a top one of the bonding components; applying a layer of adhesive to adhere the solar cells to the first major surface of the flexible backing substrate, wherein the layer of adhesive is applied such that the layer of adhesive has openings to expose the conductive traces on the first major surface of the flexible backing substrate; and interconnecting the solar cells of the adjacent solar cell subassemblies by means of the respective conductive traces on the first major surface of the flexible backing substrate, through the respective openings, wherein interconnecting comprises bonding the other end of the interconnector directly to a respective conductive trace on the first major surface of the flexible backing substrate.

According to another embodiment of the present disclosure, there is provided a space/aviation craft including the flexible solar array according to the embodiments of the present disclosure.

BRIEF DESCRIPTION OF THE DRAWINGS

The accompanying drawings, which are incorporated in and constitute a part of the specification, illustrate embodiments of the invention and, together with the description, serve to explain the principles of the invention.

Further aspects, features and advantages of the present invention will be understood from the following description with reference to the drawings.

DESCRIPTION OF THE EMBODIMENTS

Figure 1:
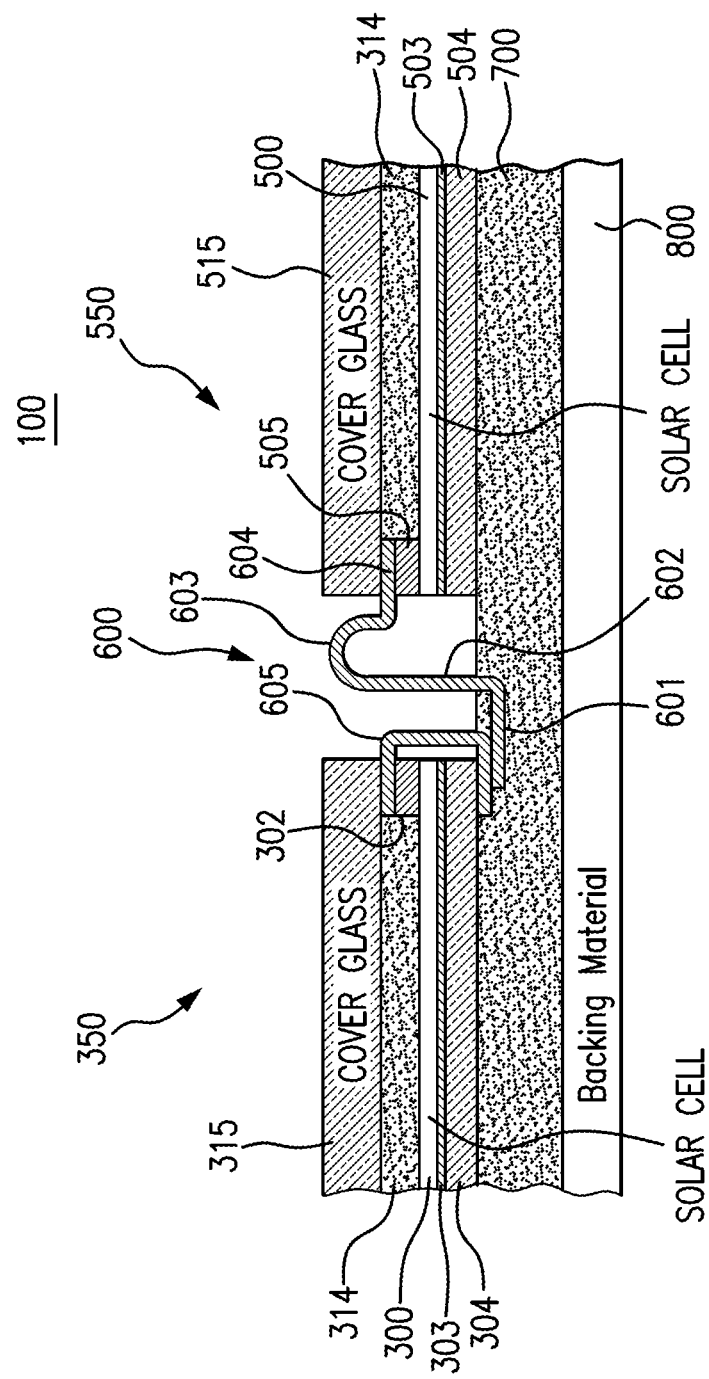
FIG. 1 is a simplified sectional view illustrating two solar cells in a conventional flexible solar array for space applications.

FIG. 1 is a simplified sectional view illustrating the interconnection of two solar cells in a conventional flexible solar array 100 for space applications. The solar array 100 includes a backing substrate 800 which is flexible and formed from, for example, polyimide, or other suitable material. The solar array 100 further includes a plurality of substantially identical solar cell subassemblies of which we illustrate two subassemblies 350 and 550, which are attached to the backing substrate 800 with adhesive layer 700.

The solar cell subassembly 350 comprises a solar cell (300) with top bonding component (for example, a metal bonding pad) 302 and bottom bonding component (or back-metal disposed on the back of the solar cell 300) 303 on opposite functional surfaces thereof. The solar cell 300 is mounted on a glass support 304. A V-shaped connector 605 is coupled to bonding pad 302 on the bottom of the glass support 304. A cover glass 315 extends over the solar cell 300 and the connector 605. The cover glass 315 can be bonded to the solar cell by means of adhesive 314 or other physical means, as known in the art. To simplify the drawing, the left hand portion of the assembly 350 is not illustrated since it is identical to the left hand portion of the depicted subassembly 550 which is disposed to the right of the subassembly 350.

The solar cell subassembly 550, as shown in FIG. 1, has a structure similar to that of the solar cell subassembly 350. The solar cell subassembly 550 includes a solar cell 500 with a bonding pad 505 on the top surface thereon; a connector 600 is coupled to the bonding pad 505 at one end 604 and coupled to the solar cell 300 by means of the other end 601 being coupled to the connector 605 of the solar cell subassembly 350. A cover glass 515 is disposed over the solar cell 500 and the end portion 604 of the connector 600. The connectors 600 and 605 generally are formed of metal or metal alloy, and may often be referred to as "interconnectors" in the art. The solar cell assemblies 350 and 550 may be referred as interconnected solar cells ("ICs"), or glass-covered and interconnected solar cell ("CICs") in the case that the ICs are covered with glass covers.

As shown in FIG. 1, the bottom part of the interconnectors 600 and 605 are buried in the adhesive layer. In this conventional solar cell array, the interconnector 600 includes four portions 601-604. A first horizontal portion 601 is bonded to the bottom bonding pad 303 on the bottom surface of the solar cell 300 via the connector 605. A second portion 602 is coupled with the first horizontal portion and angled with respect to the first horizontal portion 601, for example, with an angle of approximately 90 degree. A third portion 603 is coupled with the second portion 602, and the third portion 603 is preferably a strain relief member, for example, a strain relief loop. A fourth horizontal portion 604 is coupled with third portion and bonded to the bonding pad 505 of the solar cell subassembly 550.

Further, it is readily understood by those skilled in the art that the subassemblies 350 and 550 are exemplified only for descriptive purpose, and do not necessarily mean or imply that the subassemblies must be used or maintained as a whole in the fabricating or use of the solar arrays. To simplify the drawing, the right hand portion of the assembly 550 is not illustrated since it is identical to the right hand portion of the assembly 350.

As can be readily seen from FIG. 1, the interconnector 600 is a discrete and out-of-plane connector from the solar cells, and thus it occupies more space between the solar cells. Further, the interconnector 600 may come into contact with the CIC, particularly with the connector 605, when the solar cell array is under a bending force. As a result, there may be robustness and/or reliability issues in the conventional flexible solar arrays when subject to such forces. In other embodiments, an in-plane connector may be utilized.

Figure 2:
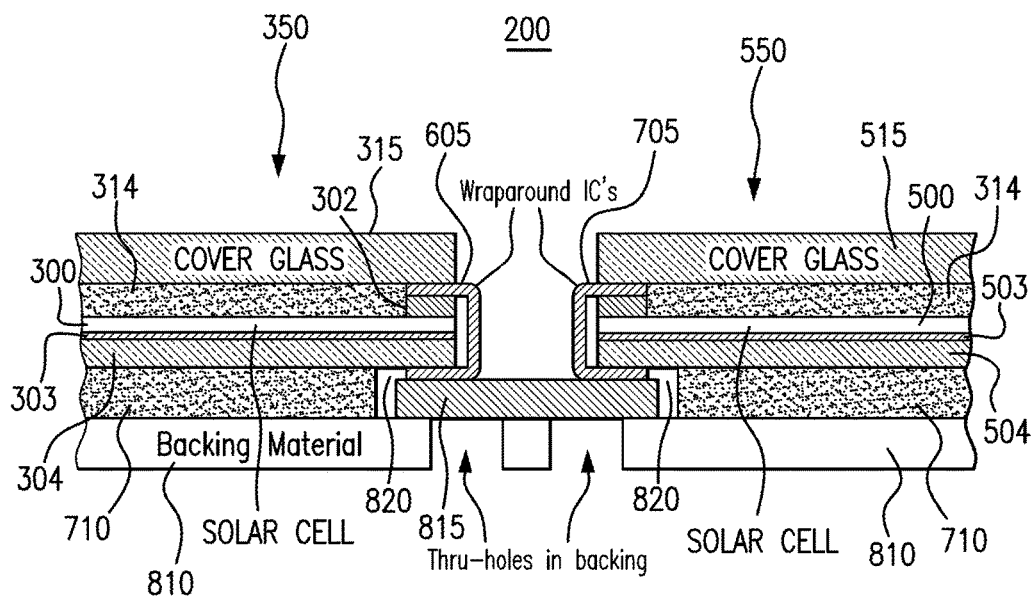
FIG. 2 is a simplified sectional view illustrating a flexible solar array according to an embodiment of the present disclosure.

FIG. 2 is a simplified sectional view illustrating a flexible solar array 200 according to an embodiment of the present disclosure. The solar array 200 according to the embodiment of the present disclosure includes a backing substrate 810 which is flexible and has conductive metal trace(s) 815 formed thereon.

A conductive trace consists of a simple structure formed on a surface of a substrate. Typically, conductive traces can be formed on a surface of a substrate by methods such as printing, etching, and/or depositing often using conventional printing techniques (e.g., conductive inks), deposition and/or etching techniques (e.g., using masks), and/or other lithographic techniques. In one embodiment, the conductive metal traces are formed in a surface of the substrate using metal evaporation methods. In another embodiment, the conductive metal traces 815 can be formed by, for example: forming a metal layer on the backing substrate 810, by plating or similar process; and patterning the metal layer into the metal traces 815, for example, by lithography and etching. In another embodiment, the conductive metal traces 815 can be bonded to the flexible backing substrate 810. The metal trace may have a thickness of from 0.02 to 0.08 mm, or in some embodiment up to 0.1 mm.

The solar array 200 further includes solar cell subassemblies 350 and 550 the solar cells 300 and 500 of which are attached to the backing substrate 810 with adhesive layer 710. The adhesive layer 710 has opening(s) 820 formed therein so as to expose the corresponding metal trace(s) 815 of the underlying backing substrate 810 through the openings so that the exposed metal traces are adaptable to interconnect the solar cells of the respective adjacent solar cell subassemblies through the openings. The solar cell subassembly 350 of FIG. 2 has the same structure with that of the solar cell subassembly 350 of FIG. 1, and thus will not be repeatedly described in detail. The solar cell subassembly 550, as shown in FIG. 2, has a structure similar to that of the solar cell subassembly 350 except for the introduction of the second wrap-around connectors 705. It is to be noted that the connectors 605 and 705 of the solar cell assemblies 350 and 550 can be bonded to the metal trace 815, for example, by soldering, welding, by bonding with eutectic alloy of bonding pads on the cell and the connector/interconnector under heat and pressure, or the like, so that the metal trace 815 interconnects the two solar cell subassemblies 350 and 550 with aid of the connectors 605 and 705, that is, interconnect the solar cells 300 and 500 of the solar cell subassemblies 350 and 550 respectively.

In the example of FIG. 2, the connectors 605 has a U-like shape in sectional view, one leg being secured to top bonding component 302 of the solar cell, and the other leg being secured to the metal trace 815 with a top side of the other leg and to the respective metal trace with a bottom side of the other leg. The connectors 605 are disposed in vicinity of the side face of the solar cells 300 and 500, and are shown as wraparound connectors/interconnectors which externally wrap around at least a part of the side face of the respective solar cells, as well as parts of the functional surfaces of the solar cells, although the connectors 605 are not limited to the examples shown in FIG. 2.

Figure 3:
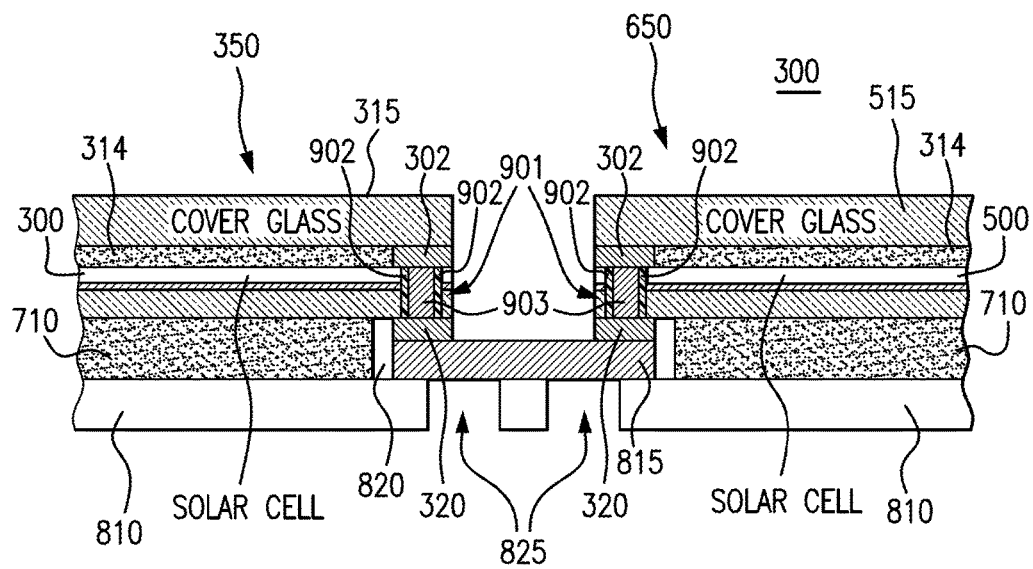
FIG. 3 is a simplified sectional view illustrating a flexible solar array according to another embodiment of the present disclosure.

As another example, a simplified sectional view of a flexible solar array 300 according to another embodiment of the present disclosure is illustrated in FIG. 3. The flexible solar array 300 has a structure similar to that of the array 200 except that the connectors 605 external to the solar cell die (FIG. 2) are replaced with internal connection components 901 through the dies of the solar cells. Also, it is to be noted that the bonding components 302 and 303 can be comprised of one layer of conductor (formed from, for example, metal(s) or metal alloy(s)) or multiple layers of conductors.

In the embodiments as shown in FIG. 2 and FIG. 3, one or more through holes 825 can be formed in the backing substrate 810 under the metal trace(s) 815 so that the strain in the backing substrate can be at least partly released when the solar array is bended or rolled. It is preferable that the through holes are fully covered by the respective metal traces and distanced from the edges of the respective metal traces.

In some implementations, the solar cells 300 and 500 can have inverted metamorphic multijunction (IMM) structures. Since the IMM structure is well known in the art, it can be omitted from being discussed in detail. Also, it is to be noted that the present invention can be applied with various solar cells with various structures/materials.

It is to be noted that the solar cell subassembly 350/650 may further include, as needed, an additional bonding pads 302 and 303 on the solar cell, and an additional connector 605 for interconnecting an additional solar cell assembly via an additional metal traces. Further, it is readily understood by those skilled in the art that the subassemblies 350 and 650 are termed only for descriptive purpose, and do not necessarily mean or imply that the subassemblies must be used or maintained as a whole in the fabricating or use of the solar arrays.

Figure 4:
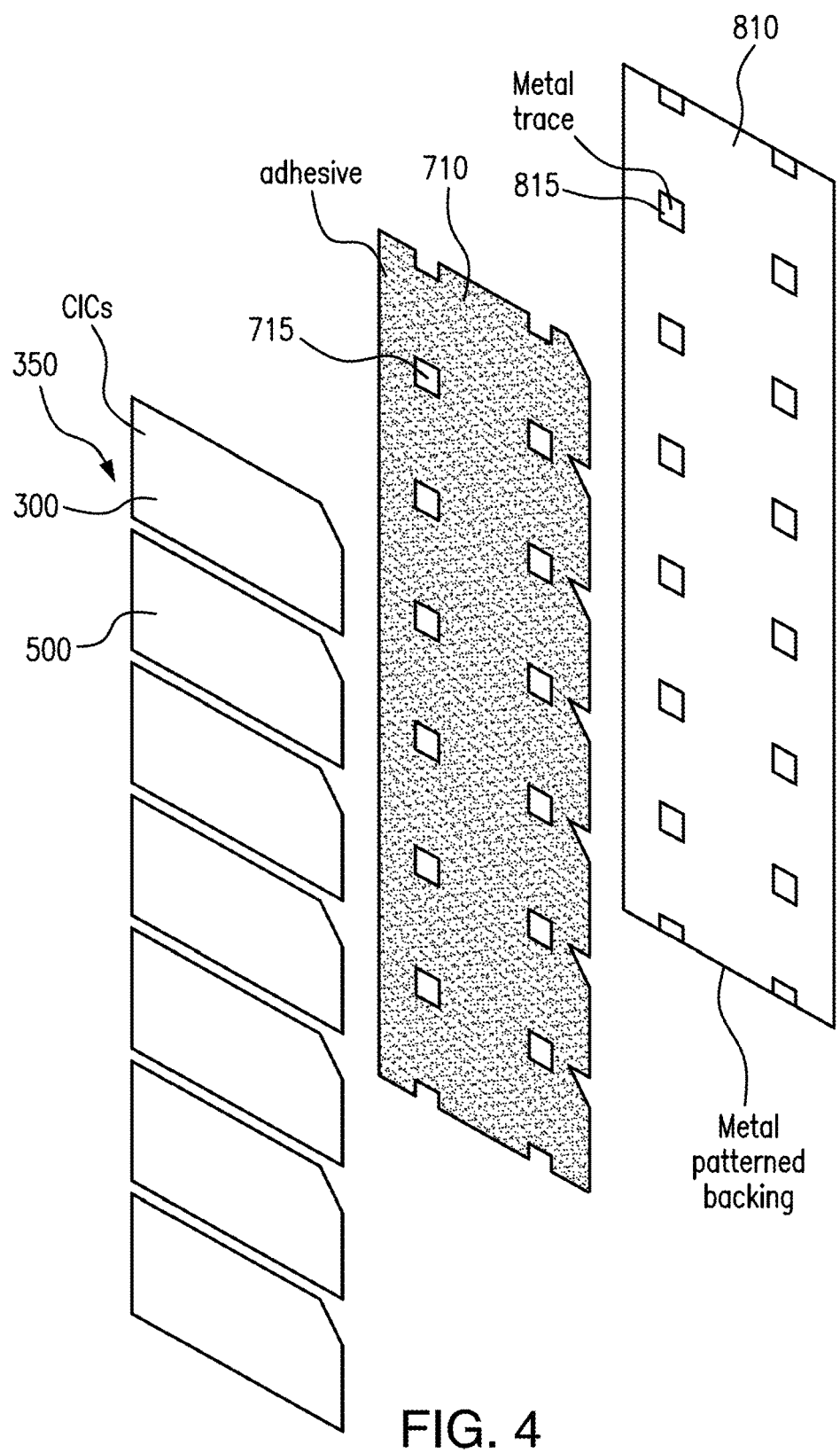
FIG. 4 is a simplified exploded view illustrating a flexible solar array according to an embodiment of the present disclosure.

FIG. 4 is a simplified exploded view illustrating a flexible solar array according to an embodiment of the present disclosure. The flexible solar array of FIG. 4 may have a structure similar to that shown in FIG. 2 or FIG. 3 except that the solar cell subassemblies are simplified without any further details shown in the figure.

A string of solar cell subassemblies including the subassemblies 350 and 650 and thus, the solar cells 300 and 500 thereof, are bonded to the metal-patterned backing substrate 810 with an adhesive layer 710. The metal traces 815 on the backing substrate 810 can be exposed through the openings 715 of the adhesive layer 710 so that the metal traces 815 can be coupled with and interconnect the solar cells 300 and 500. In some embodiments, a separate adhesive layer 710 may be eliminated, and other attachment technique employed.

Figure 5:
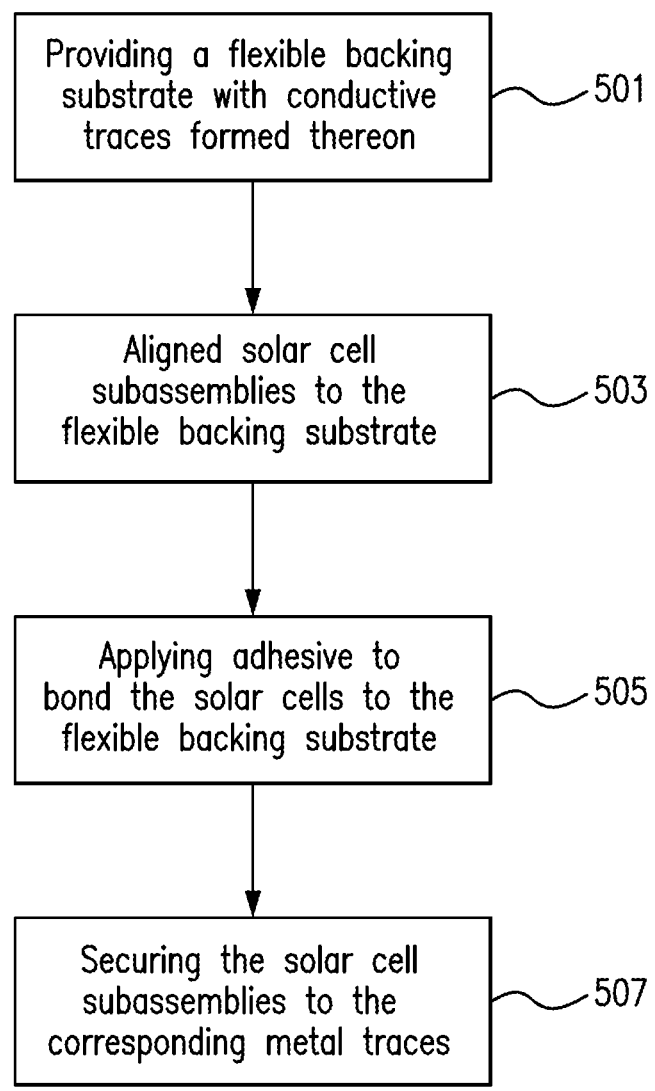
FIG. 5 is a flow chart illustrating a method for fabricating a flexible solar array according to an embodiment of the present disclosure.

FIG. 5 is a flow chart illustrating a method for fabricating a flexible solar array according to an embodiment of the present disclosure. At step 501, a flexible backing substrate with conductive traces, typically, metal traces, formed thereon is provided. In some implementations, there can be through-holes in the backing substrate under the metal trace so as to release strain. At step 503, adjacent solar cell subassemblies are aligned to the flexible backing substrate, for example, so that the connectors 605 are aligned to the corresponding metal traces 815. In some implementations, the solar cell subassemblies may be interconnected discrete solar cells, and in some other implementations, the solar cell subassemblies may further include the glass covers, that is, be glass-covered and interconnected solar cells. At step 505, adhesive 710 is applied to bond the solar cells, and thus the solar cell subassemblies, to the flexible backing substrate, and the adhesive layer 710 has openings 715 to expose the metal trace 815 of the backing substrate 810. At step 507, the solar cell subassemblies are secured onto the flexible backing substrate 810 by bonding the connectors 605, 705 to the corresponding metal traces 815 by means of soldering, welding, or the like.

It is to be noted that the steps are not necessarily performed in the order above described, for example, the glass covers 315, 515 can be applied to the solar cells either after or prior to the solar cell subassemblies being secured to the metal traces on the backing substrate.

In some embodiments, one or more of the method steps are performed using an automated process. In some embodiments, the one or more automated processes may use machine vision. Machine vision can include imaging-based automatic inspection and analysis for applications such as automatic inspection, process control, and robot guidance. Although conventional (2D visible light) imaging is most commonly used in machine vision, alternatives include imaging various infrared bands, line scan imaging, 3D imaging of surfaces, and X-ray imaging. The most commonly used method for 3D imaging is scanning based triangulation which utilizes motion of the product or image during the imaging process. Other 3D methods used for machine vision are time of flight, grid based, and stereoscopic.

For machine vision, the imaging device (e.g. camera) can either be separate from the main image processing unit or combined with it in which case the combination can be a smart camera or a smart sensor. When separated, the connection may be made to specialized intermediate hardware such as a frame grabber using either a standardized or custom interface. Machine vision can also use digital cameras capable of direct connections (without a framegrabber) to a computer.

Although the vast majority of machine vision applications use two-dimensional imaging, machine vision applications utilizing 3D imaging are a growing alternative. One method is grid array based systems using pseudorandom structured light system. Another method of generating a 3D image is to use laser triangulation, where a laser is projected onto the surfaces of an object and the deviation of the line is used to calculate the shape. In machine vision this is accomplished with a scanning motion, either by moving the workpiece, or by moving the camera and laser imaging system. Stereoscopic vision can be used in special cases involving unique features present in both views of a pair of cameras.

Solar cell wafers can be prepared by automated methods of depositing III-V compound semiconductor layers and other layers (e.g., antireflective coating. ARC) on a substrate to fabricate a wafer. Such methods that are readily amenable to automation include, for example, metal organic chemical vapor deposition (MOCVD) methods that are readily known in the art. Backside metallization of a cell can be performed, for example, by evaporation or electrodeposition on a polyimide layer (e.g., a KAPTON® layer).

Features such as grid lines and mesas can be formed on the front sides of the wafers using conventional techniques such as lithography, metal deposition, and etching techniques, all of which are readily amenable to automation using, for example, machine vision.

Solar cell configurations particularly suitable for assembly using automated processes include those that are described in U.S. patent application Ser. No. 14/592,519, filed Jan. 8, 2015; Ser. No. 14/719,911, filed May 21, 2015; Ser. No. 14/729,412, filed Jun. 3, 2015; and Ser. No. 14/729,422, filed Jun. 3, 2015, all of which are incorporated herein by reference in their entireties.

One or more solar cells can be formed from a wafer using conventional techniques such as dicing or scribing. The size and shape of the solar cells can be varied as desired for particular applications as disclosed, for example, in U.S. patent application Ser. No. 14/592,519, filed Jan. 8, 2015, which is incorporated herein by reference in its entirety. Dicing or scribing of solar cells from a wafer is particularly amenable to automation using machine vision. In some embodiments, the solar cells each have a surface area of less than 5 cm$^2$.

The functionality of the one or more solar cells can be tested by conventional automated testing equipment.

Interconnects can be attached to the one of more solar cells using, for example, automatic soldering or laser welding equipment.

In some embodiments, one end of the interconnects can have parallel gap apertures, and the interconnects can be connected, for example, by applying a parallel gap welding tool.

In some embodiments, all electrical components in the solar cell array can be continuously encapsulated with CV grade silicone, which can be used to mount multi-cell large area coverglass, or as a surface for applying advanced coatings such as Cover Glass Replacement (CGR) or radiation resistant coatings. This approach can produce an array that is electrically isolated, can mitigate high voltage arcing problems, can eliminate cracks and seams to minimize the need for expensive inter-cell grouting, and can enable electrostatic cleanliness.

Dispensing of silicone onto solar cells and coverglass has typically been performed using a patterned silk screening process or squeegee approaches. These processes require additional materials and process associated with designing and producing templates, as well as the wasteful nature of hand mixing and application. These processes are inherently wasteful and laborious, driving high cost and low process throughput. The approach described herein provides for the simple low cost and high precision application of silicone adhesive to solar cell assemblies with standardized carriers.

In some embodiments, a silicone can be dispensed on the solar cell using, for example, an automated Asymtek machine with visual recognition for maximum precision.

A cover glass can be attached to each solar cell to form a Cell-Interconnect-Cover Glass (CIC) using automated methods. For example, in some embodiments the CIC assembly process can be completed with the implementation of automated assembly and lamination. After large area or precision dispensing operations have been performed, a temporary carrier can be fixtured in a component placement machine. Using computerized visual recognition of fiducial location points, a numerically controlled component placement machine can pick the large area solar cell coverglass from a cartridge stack, placing this upon the uncured silicone dispensed in the previous step, which can then be cured to form the CIC.

In some embodiments, a similar component placement step can be implemented to both load a wire-bonding machine, as well as to perform the final submodule placement onto any suitable number of solar array substrates such as a flexible membrane or a rigid composite sandwich panel. Such automated methods can reduce or eliminate labor intensive hand operations from the entire process.

CICs can be positioned and placed on a support in an automated manner, for example, by a pick and place assembly tool to form a string configuration of CICs as described, for example, in U.S. patent application Ser. No. 14/719,911, filed May 21, 2015, and Ser. No. 14/729,412, filed Jun. 3, 2015, both of which are incorporated herein by reference in their entireties. Bypass and blocking diodes can be configured by similar methods.

Solar cell in a string can be interconnected using, for example, standard automation equipment for wire bonding such as an automated thermosonic wire-bonding machine, and also as disclosed, for example, in U.S. patent application Ser. No. 14/719,911, filed May 21, 2015, which is incorporated herein by reference in its entirety.

String configurations or interconnected string configurations of solar cells positioned and placed on a support in an automated manner, for example, by a pick and place assembly tool as described, for example, in U.S. patent application Ser. No. 14/719,911, filed May 21, 2015, and Ser. No. 14/729,412, filed Jun. 3, 2015, both of which are incorporated herein by reference in their entireties. In certain embodiments, the string configurations or interconnected string configurations of solar cells can be bonded to the substrate by the automatic application of pressure and/or heat and interconnected in a similar manner as discussed herein above.

Configuring and wiring a panel circuit and terminal can be performed using conventional automated wiring equipment.

Testing the functionality of the solar cell panel can be performed by automated methods similar to those discussed herein above for testing of individual solar cells. For example, 5-cell submodules have been fabricated using the processes described herein. Testing on the submodules performed included electrical continuity, grounding, and isolation testing. The submodules were subjected them to thermal cycling from −120° C. to +120° C. to represent typical LEO orbital conditions; from −180° C. to +80° C. to represent typical GEO orbital conditions; and in a related program, to plasma environments at high voltage, as an initial qualification to Low Earth Orbit environments. All tests showed good performance and reliability for the solar cell strings before and after exposure to these environments.

The flexible solar arrays according to the present disclosure can be adaptable to be used for space/aviation applications, that is to say, adaptable to be used with space/aviation crafts. Therefore, it is intended to embrace those space/aviation crafts including the flexible solar array according to the present disclosure in the scope of the present invention.

It is to be noted that the terms "front", "back", "top", "bottom", "over", "on", "under", and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

In the claims, the word 'comprising' or 'having' does not exclude the presence of other elements or steps then those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present invention can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the invention.

Although some specific embodiments of the present invention have been demonstrated in detail with examples, it should be understood by a person skilled in the art that the above examples are only intended to be illustrative but not to limit the scope of the present invention. It should be understood that the above embodiments can be modified without departing from the scope and spirit of the present invention which are to be defined by the attached claims.

The invention claimed is:

1. A flexible solar array comprising:
a flexible backing substrate comprising a first major surface and an opposing second major surface;
conductive trace(s) disposed on the first major surface of the flexible backing substrate, wherein the flexible backing substrate further comprises through-holes under each of the respective conductive traces on the first major surface of the flexible backing substrate, the through holes being fully covered by the respective conductive traces on the first major surface of the flexible backing substrate and spatially distanced from the edges of the respective conductive traces on the first major surface of the flexible backing substrate;
a plurality of solar cell subassemblies disposed over the first major surface of the flexible backing substrate, each of the solar cell subassemblies at least including a solar cell; and
an adhesive layer interposed between the solar cell subassemblies and the first major surface of the flexible backing substrate, and attaching the solar cells to the first major surface of the flexible backing substrate, wherein the adhesive layer includes openings for exposing the corresponding conductive traces on the first major surface of the flexible backing substrate so that the exposed conductive traces are adaptable to interconnect the solar cells of the respective adjacent solar cell subassemblies through the openings.

2. The solar array as defined in claim 1,
(i) wherein the solar cell comprises bonding pad areas on opposite functional surfaces of the solar cell;
(ii) wherein the solar cell subassembly further comprises a metal or metal alloy interconnector disposed in close proximity of a side face of the solar cell, one end of the interconnector being bonded to a top one of the bonding areas and the other end thereof being bonded directly to a respective conductive trace on the first major surface of the flexible backing substrate; and
(iii) wherein the interconnectors of adjacent solar cell subassemblies are coupled with a corresponding conductive trace for the adjacent solar cell assemblies.

3. The flexible solar array according to claim 2, wherein: the solar cell subassembly further comprises a cover glass attached over the respective solar cell and the interconnector.

4. The flexible solar array according to claim 2, wherein: the interconnector has a U shape in a cross-sectional view, one leg of the "U" of the interconnector being secured to a top bonding pad of the solar cell and the other leg of the "U" of the interconnector being directly secured at a bottom side of the other leg to the respective conductive trace on the first major surface of the flexible backing substrate.

5. The flexible solar array according to claim 1, wherein the flexible solar array is space qualified, and the openings in the adhesive layer are square in shape and aligned along a plurality of lines over the adhesive layer.

6. The flexible solar array according to claim 1, wherein the solar cells each have a surface area of less than 5 cm$^2$.

7. The flexible solar array according to claim 1, wherein the solar cells are inverted metamorphic multijunction solar cells.

8. A flexible solar array comprising:
a flexible backing substrate comprising a first major surface and an opposing second major surface;
conductive trace(s) disposed on the first major surface of the flexible backing substrate, wherein the flexible backing substrate further comprises through-holes under each of the respective conductive traces on the first major surface of the flexible backing substrate, the through holes being fully covered by the respective conductive traces on the first major surface of the flexible backing substrate and spatially distanced from the edges of the respective conductive traces on the first major surface of the flexible backing substrate;
a plurality of solar cell subassemblies disposed over the first major surface of the flexible backing substrate, each of the solar cell subassemblies at least including a solar cell; and
an adhesive layer interposed between the solar cell subassemblies and the first major surface of the flexible backing substrate, and attaching the solar cells to the first major surface of the flexible backing substrate.

9. The solar array as defined in claim 8,
(i) wherein the solar cell comprises bonding pad areas on opposite functional surfaces of the solar cell;
(ii) wherein the solar cell subassembly further comprises a metal or metal alloy interconnector disposed in close proximity of a side face of the solar cell, one end of the interconnector being bonded to a top one of the bonding areas and the other end thereof being bonded directly to a respective conductive trace on the first major surface of the flexible backing substrate; and (iii) wherein the interconnectors of adjacent solar cell subassemblies are coupled with a corresponding conductive trace for the adjacent solar cell assemblies.

10. The flexible solar array according to claim 9, wherein: the solar cell subassembly further comprises a cover glass attached over the respective solar cell and the interconnector.

11. The flexible solar array according to claim 9, wherein: the interconnector has a U shape in a cross-sectional view, one leg of the "U" of the interconnector being secured to a top bonding pad of the solar cell and the other leg of the "U" of the interconnector being directly secured at a bottom side of the other leg to the respective conductive trace on the first major surface of the flexible backing substrate.

12. The flexible solar array according to claim 9, wherein the flexible solar array is space qualified.

13. The flexible solar array according to claim 9, wherein the solar cells each have a surface area of less than 5 cm$^2$.

14. A space/aviation craft including a flexible solar array, the flexible solar array comprising:
- a flexible backing substrate comprising a first major surface and an opposing second major surface, with conductive trace(s) formed on the first major surface of the flexible backing substrate by metal evaporation, wherein the flexible backing substrate further comprises through holes under the respective conductive traces on the first major surface of the flexible backing substrate, and the through holes are fully covered by the respective conductive traces on the first major surface of the flexible backing substrate and distanced from edges of the respective conductive traces on the first major surface of the flexible backing substrate;
- solar cell subassemblies disposed over the first major surface of the flexible backing substrate, each of the solar cell subassemblies at least including a solar cell; and
- an adhesive layer interposed between the solar cell subassemblies and the first major surface of the flexible backing substrate, and attaching the solar cells to the first major surface of the flexible backing substrate,
- wherein the adhesive layer includes openings for exposing the corresponding conductive traces on the first major surface of the flexible backing substrate so that the exposed conductive traces on the first major surface of the flexible backing substrate are adaptable to interconnect the solar cells of the respective adjacent solar cell subassemblies through the openings,
- wherein the solar cell comprises bonding areas on opposite functional surfaces of the solar cell;
- wherein the solar cell subassembly further comprises a metal or metal alloy interconnector having a U shape in sectional view disposed in close proximity of a side face of the solar cell, one leg of the interconnector being bonded to a top one of the bonding areas and a bottom side of the other leg thereof being bonded directly to a respective conductive trace on the first major surface of the flexible backing substrate;
- wherein the interconnectors of adjacent solar cell subassemblies are coupled with a corresponding conductive trace for the adjacent solar cell assemblies, and
- wherein the solar cell subassembly further comprises a cover glass attached over the solar cell and the interconnector.

15. A space/aviation craft as defined in claim 14, wherein the flexible backing substrate is a polyimide material.

* * * * *